(12) United States Patent
Choi et al.

(10) Patent No.: US 9,269,775 B2
(45) Date of Patent: Feb. 23, 2016

(54) TUNNELING DEVICES AND METHODS OF MANUFACTURING THE SAME

(71) Applicant: Samsung Electronics Co., Ltd., Suwon-Si, Gyeonggi-Do (KR)

(72) Inventors: Jun-hee Choi, Seongnam-si (KR); Won-jong Yoo, Suwon-si (KR); Seung-hwan Lee, Suwon-si (KR); Min-sup Choi, Suwon-si (KR); Xiao Chi Liu, Suwon-si (KR); Ji-a Lee, Suwon-si (KR)

(73) Assignees: SAMSUNG ELECTRONICS CO., LTD., Gyeonggi-Do (KR); SUNGKYUNKWAN UNIVERSITY FOUNDATION FOR CORPORATE COLLABORATION, Gyeonggi-Do (KR)

(*) Notice: Subject to any disclaimer, the term of this patent is extended or adjusted under 35 U.S.C. 154(b) by 59 days.

(21) Appl. No.: 14/188,862

(22) Filed: Feb. 25, 2014

(65) Prior Publication Data

US 2015/0014630 A1    Jan. 15, 2015

(30) Foreign Application Priority Data

Jul. 15, 2013  (KR) .................. 10-2013-0083154

(51) Int. Cl.
| | |
|---|---|
| *H01L 29/737* | (2006.01) |
| *H01L 29/16* | (2006.01) |
| *H01L 29/73* | (2006.01) |
| *H01L 29/66* | (2006.01) |
| *H01L 29/88* | (2006.01) |

(52) U.S. Cl.
CPC ........ *H01L 29/1606* (2013.01); *H01L 29/6603* (2013.01); *H01L 29/7311* (2013.01); *H01L 29/7376* (2013.01); *H01L 29/88* (2013.01)

(58) Field of Classification Search
CPC ............ H01L 29/0895; H01L 29/7311; H01L 29/7376; H01L 29/66151; H01L 29/88; H01L 29/882; H01L 29/885
See application file for complete search history.

(56) References Cited

U.S. PATENT DOCUMENTS

| | | | |
|---|---|---|---|
| 2011/0089403 A1 | 4/2011 | Woo et al. | |
| 2011/0140064 A1* | 6/2011 | Bandyopadhyay et al. | 257/2 |
| 2011/0186805 A1* | 8/2011 | Bowers et al. | 257/9 |
| 2011/0309335 A1* | 12/2011 | Mehr | H01L 29/16 257/26 |

(Continued)

FOREIGN PATENT DOCUMENTS

KR     2012-0118566 A     10/2012

OTHER PUBLICATIONS

Late, Dattatray J. et al., "GaS amd GaSe Ultrathin Layer Transistors," Advanced Materials, 2012, p. 3549-3554, vol. 24, Wiley-VCH Verlag GmbH & co. CGaA, We.inheim.

(Continued)

*Primary Examiner* — Benjamin Sandvik
(74) *Attorney, Agent, or Firm* — Harness, Dickey & Pierce, P.L.C.

(57) ABSTRACT

A tunneling device may include a tunnel barrier layer, a first material layer including a first conductivity type two-dimensional material on a first surface of the tunnel barrier layer and a second material layer including a second conductivity type two-dimensional material on a second surface of the tunnel barrier layer. The tunneling device may use a tunneling current through the tunnel barrier layer between the first material layer and the second material layer.

21 Claims, 9 Drawing Sheets

(56) References Cited

U.S. PATENT DOCUMENTS

| | | | |
|---|---|---|---|
| 2012/0049160 A1 | 3/2012 | Sano et al. | |
| 2012/0074387 A1 | 3/2012 | King | |
| 2012/0115296 A1* | 5/2012 | Vandenderghe | B82Y 10/00 438/283 |
| 2012/0329260 A1 | 12/2012 | Avouris et al. | |
| 2014/0097403 A1* | 4/2014 | Heo | H01L 29/7391 257/27 |

OTHER PUBLICATIONS

Radisavljevic, B. et al., "Single-layer $MoS_2$ transistors," Nature Nanotechnology, 2011, p. 147-150, vol. 6, Macmillan Publishers Limited.

Wang, Feng et al., "Gate-Variable Optical Transitions in Graphene," Science, 2008, p. 206-209, vol. 320, American Association for the Advancement of Science, Washington, D. C.

Shin, Hyeon-Jin et al., "Control of Electronic Structure of Graphene by Various Dopants and Their Effects on a Nanogenerator," J. Am. Chem. Soc. Articles, 2010, p. 15603-15609, vol. 132, No. 44, American Chemical Society.

Ma, Rongchao et al. "Persistent supercurrents in ring-shaped $Bi_2Sr_2CaCu_2O_x$ single crystal," Journal of Applied Physics, 2010, p. 083909-083909-4, vol. 107, American Institute of Physics.

Fang, Hui et al., "High-Performance Single Layered $WSe_2$ p-FETs with Chemically Doped Contacts," Nano Letters, 2012, p. 3788-3792, vol. 12, American Chemical Society.

Yu, Woo Jong et al., "Toward Tunable Band Gap and Tunable Dirac Point in Bilayer Graphene with Molecular Doping," Nano Letters, 2011, p. 4759-4763, vol. 11, American Chemical Society.

Farmer, Damon B. et al., "Behavior of a chemically doped graphene junction," Applied Physics Letters, 2009, p. 213106-1-p. 213106-3, vol. 94, American Institute of Physics.

Britnell, L. et al., "Field-Effect Turnneling Transistor Based on Veritical Graphene Heterostructures," Science, 2012, p. 947-950, vol. 335, American Association for the Advancement of Science, Washington D.C.

Ionescu, Adrian M. et al., "Tunnel field-effect transistors as energy-efficient electronic switches," Nature, 2011, p. 329-337, vol. 479, Macmillan Publishers Limited.

* cited by examiner

TUNNELING DEVICES AND METHODS OF MANUFACTURING THE SAME

CROSS-REFERENCE TO RELATED APPLICATIONS

This application claims the benefit of Korean Patent Application No. 10-2013-0083154, filed on Jul. 15, 2013, in the Korean Intellectual Property Office, the disclosure of which is incorporated herein in its entirety by reference.

BACKGROUND

1. Field

Some example embodiments relate to semiconductor devices and/or methods of manufacturing the same, and more particularly, to tunneling devices and/or methods of manufacturing the same.

2. Description of the Related Art

With the widespread use of smart phones and high-tech electronic products, the importance of devices operating at low power is increasing. In this regard, technology for reducing an operation voltage of semiconductor devices and reducing a minimum leakage current thereof is becoming important.

Since a tunneling field effect transistor (TFET) uses a band-to-band tunneling mechanism, the TFET has a lower off-current, a higher on/off current ratio, and lower power consumption than a metal-oxide-semiconductor FET (MOSFET). However, the TFET, which is advantageous as a low-power device, has a low on-current because it uses a tunneling mechanism.

SUMMARY

Some example embodiments provide tunneling devices that may have increased tunneling current intensity and tunneling probability.

Other example embodiments provide tunneling devices that may have an increased on-current level.

Other example embodiments provide tunneling devices that have rectification characteristics.

Other example embodiments provide tunneling devices that have a two-terminal structure.

Other example embodiments provide tunneling devices that use a chemically-doped two-dimensional material.

Other example embodiments provide tunneling devices that use a P-type two-dimensional (2D) material and/or an N-type 2D material.

Other example embodiments provide tunneling devices that have controlled/improved operation characteristics.

Other example embodiments provide methods of manufacturing the above tunneling devices.

Additional aspects will be set forth in part in the description which follows and, in part, will be apparent from the description, or may be learned by practice of the presented embodiments.

According to an example embodiment, a tunneling device includes a tunnel barrier layer, a first material layer on a first surface of the tunnel barrier layer and including a P-type two-dimensional (2D) material; and a second material layer on a second surface of the tunnel barrier layer and including an N-type 2D material, wherein the tunneling device uses a tunneling current through the tunnel barrier layer between the first material layer and the second material layer.

The P-type 2D material may include graphene doped with a P-type dopant. The N-type 2D material may include graphene doped with an N-type dopant.

The first material layer may have a work function of about 5.0 eV to about 5.9 eV. The second material layer may have a work function of about 3.2 eV to about 4.0 eV.

The tunnel barrier layer may include a 2D material. The tunnel barrier layer may include one of hexagonal boron nitride (h-BN), $MoS_2$, $MoSe_2$, $MoTe_2$, $WS_2$, $WSe_2$, $WTe_2$, GaS, and GaSe, for example. The tunnel barrier layer may include a transition metal dichalcogenide (TMDC) material.

The P-type 2D material may include a P-type TMDC material. The N-type 2D material may include an N-type TMDC material.

The P-type 2D material may include one of $WSe_2$, $NbSe_2$, and GaSe. The N-type 2D material may include one of $MoS_2$, $MoSe_2$, $MoTe_2$, $WS_2$, $WSe_2$, $WTe_2$, and GaS. The tunnel barrier layer may include h-BN or a dielectric (e.g., oxide) having a bandgap of more than about 1.0 eV.

The tunneling device may have rectification characteristics.

The tunneling device may have a two-terminal structure.

The tunneling device may further include a first electrode contacting the first material layer and a second electrode contacting the second material layer.

The tunneling device may further include a substrate including one of the first material layer and the second material layer on a surface thereof, wherein the tunnel barrier layer is on a first region of the one of the first material layer and the second material layer to extend to a region of the substrate adjacent to the first region of the one of the first material layer and the second material layer, and the other of the first material layer and the second material layer is on a first region of the tunnel barrier layer, a first electrode on a second region of the one of the first material layer and the second material layer to extend to a second region of the tunnel barrier layer adjacent to the second region of the one of the first material layer and the second material layer, and a second electrode on the other of the first material layer and the second material layer.

According to another example embodiment, a method of manufacturing a tunneling device includes forming a first material layer of a first conductivity type two-dimensional (2D) material on a substrate, forming a tunnel barrier layer on the first material layer, and forming a second material layer of a second conductivity type 2D material on the tunnel barrier layer.

The first material layer may be formed by forming a first graphene layer on the substrate, and doping the first graphene layer with a first conductivity type dopant by a chemical doping process.

The first graphene layer may be doped with a P-type dopant, and the P-type dopant may have at least one of $AuCl_3$ and diazonium salt as a source.

The second material layer may be formed by forming a second graphene layer on the tunnel barrier layer, and doping the second graphene layer with a second conductivity type dopant by a chemical doping process.

The second graphene layer may be doped with an N-type dopant, and the N-type dopant may have at least one of benzyl-viologen (BV) and polyethylenimine (PEI) as a source.

The first material layer may have a work function of about 5.0 eV to about 5.9 eV. The second material layer may have a work function of about 3.2 eV to about 4.0 eV.

The tunnel barrier layer may include a 2D material. The tunnel barrier layer may include one of hexagonal boron nitride (h-BN), $MoS_2$, $MoSe_2$, $MoTe_2$, $WS_2$, $WSe_2$, $WTe_2$, GaS, and GaSe, for example.

The first material layer may include one of $WSe_2$, $NbSe_2$, and GaSe. The second material layer may include one of $MoS_2$, $MoSe_2$, $MoTe_2$, $WS_2$, $WSe_2$, $WTe_2$, and GaS.

The method may further include forming a first electrode contacting the first material layer, and forming a second electrode contacting the second material layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
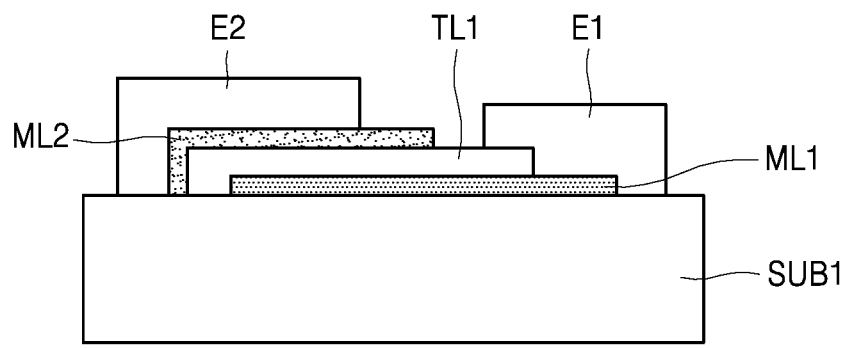
FIG. 1 is a cross-sectional view illustrating a tunneling device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, tunneling devices and methods of manufacturing the same, according to embodiments of the present invention, will be described in detail with reference to the accompanying drawings. In the drawings, the widths and thicknesses of layers and regions are exaggerated for clarity. Throughout the specification, like reference numerals denote like elements.

FIG. 1 is a cross-sectional view illustrating a tunneling device according to an example embodiment.

Referring to FIG. 1, a first material layer ML1 may be provided on a substrate SUB1. The first material layer ML1 may include a first conductivity type (e.g., P-type) two-dimensional (2D) material or a 2D material doped with a first conductivity type (e.g., P-type) dopant (or having a doped effect). A tunnel barrier layer TL1 may be provided on the first material layer ML1. A second material layer ML2 may be provided on the tunnel barrier layer TL1. The second material layer ML2 may include a second conductivity type (e.g., N-type) 2D material or a 2D material doped with a second conductivity type (e.g., N-type) dopant (or having a doped effect). The tunnel barrier layer TL1 may be provided between the first material layer ML1 and the second material layer ML2. The tunneling device may further include a first electrode E1 contacting the first material layer ML1, and a second electrode E2 contacting the second material layer ML2. Hereinafter, the respective elements of the tunneling device of FIG. 1 will be described in more detail.

For example, the substrate SUB1 may include a silicon substrate. In this case, the substrate SUB1 may further include a silicon oxide layer formed on the silicon substrate. Thus, the substrate SUB1 may have an $Si/SiO_2$ structure. The first material layer ML1, the tunnel barrier layer TL1, and the second material layer ML2 may be provided on the silicon oxide ($SiO_2$) layer. However, the material of the substrate SUB1 is not limited to silicon, but may be modified variously. Also, the material of the silicon oxide layer may be modified variously. The silicon oxide layer (i.e., underlayer) may not be formed.

The first material layer ML1 may be formed of a first conductivity type (e.g., P-type) 2D material or a 2D material doped with a first conductivity type (e.g., P-type) dopant (or having a doped effect). The second material layer ML2 may be formed of a second conductivity type (e.g., N-type) 2D material or a 2D material doped with a second conductivity type (e.g., N-type) dopant (or having a doped effect). A 2D material may be a single-atom-layer (or half-layer) solid, in which atoms form a given (or, alternatively predetermined) crystalline structure, and may have conductor (semimetal) or semiconductor characteristics. An example of the 2D material is graphene. Graphene has a single-layer (single-atom-layer) structure in which carbon atoms form a hexagonal structure. Graphene may have a symmetric band structure around a Dirac point. Since the effective mass of a charge is very small at the Dirac point, graphene may have at least about ten times (at most about 1,000 times) higher charge mobility than silicon (Si). Also, graphene may have a very high Fermi velocity $V_F$. Thus, the use of the 2D material such as graphene may increase the tunneling probability and the tunneling current of the tunneling device.

In this embodiment, the first material layer ML1 may include graphene doped with a P-type dopant, and the second material layer ML2 may include graphene doped with an N-type dopant. That is, the first material layer ML1 may include P-doped graphene, and the second material layer ML2 may include N-doped graphene. The first material layer ML1 and the second material layer ML2 may be chemically doped with the P-type dopant and the N-type dopant, respectively. Since the first material layer ML1 is P-doped and the second material layer ML2 is N-doped, their work functions may be different from each other. For example, the P-doped graphene may have a work function of about 4.9 eV to about 5.9 eV or about 5.0 eV to about 5.9 eV. The N-doped graphene may have a work function of about 3.2 eV to about 4.3 eV or about 3.2 eV to about 4.0 eV. Thus, the first material layer ML1 may have a work function of about 4.9 eV to about 5.9 eV or about 5.0 eV to about 5.9 eV, and the second material layer ML2 may have a work function of about 3.2 eV to about 4.3 eV or about 3.2 eV to about 4.0 eV. A difference between the work function of the first material layer ML1 and the work function of the second material layer ML2 may be about 0.6 eV to about 2.7 eV or about 1.0 eV to about 2.7 eV. In this manner, when the first material layer ML1 and the second material layer ML2 have different work functions, the energy band structure of the tunnel barrier layer TL1 may be bent, and thus its tunneling efficiency and on-current may be considerably improved. Also, the tunneling device of this embodiment may have rectification characteristics similar to those of a diode. This will be described later in detail.

In addition, when the first material layer ML1 and the second material layer ML2 are formed of graphene, the first material layer ML1 and the second material layer ML2 may each include a single graphene layer or a stack of about ten (or about five) or less graphene layers. Even when a few (about ten or less) graphene layers are stacked, the inherent characteristics of the graphene may be maintained. This may also be true in the case where the first material layer ML1 and the second material layer ML2 include 2D materials other than graphene.

The tunnel barrier layer TL1 may be a material layer having a given (or, alternatively predetermined) bandgap. The tunnel barrier layer TL1 may include a 2D material. The 2D material of the tunnel barrier layer TL1 may be materials other than graphene. For example, the tunnel barrier layer TL1 may include one of hexagonal boron nitride (h-BN), $MoS_2$, $MoSe_2$, $MoTe_2$, $WS_2$, $WSe_2$, $WTe_2$, GaS, and GaSe. Also, the tunnel barrier layer TL1 may include a transition metal dichalcogenide (TMDC) material. For example, the TMDC material may be represented by $MX_2$, where M is a transition metal and X is a chalcogen element. The M may be Ti, Zr, Hf, V, Nb, Ta, Mo, W, or the like and the X may be S, Se, or Te. For example, the TMDC material may be $MoS_2$, $MoSe_2$, $MoTe_2$, $WS_2$, $WSe_2$, or $WTe_2$. When the tunnel barrier layer TL1 is formed of the 2D material, the tunnel barrier layer TL1 may have a single-layer structure or a multi-layer structure including a stack of layers. In some cases, the tunnel barrier layer TL1 may be formed of materials other than the 2D material. For example, the tunnel barrier layer TL1 may be formed of a dielectric (e.g., oxide) having a bandgap of more than about 1.0 eV (or 2.0 eV). For example, the dielectric (e.g., oxide) may be $Al_2O_3$, HfOx, $SiO_2$, or the like. The tunnel barrier layer TL1 may be a dielectric layer or a semiconductor layer having a relatively large bandgap. The tunnel barrier layer TL1 may have a thickness of about 10 nm or less. However, in some cases, the tunnel barrier layer TL1 may have a thickness of about 10 nm or more. The operation voltage of the tunneling device according to this embodiment may vary depending on the thickness and material of the tunnel barrier layer TL1.

The first electrode E1 and the second electrode E2 may be formed of a metal, a metal compound, a conductive oxide, or the like. The first electrode E1 and the second electrode E2 may have a single-layer structure or a multi-layer structure. For example, each of the first electrode E1 and the second electrode E2 may have a multi-layer structure including a Ti layer and an Au layer, that is, a Ti/Au structure. However, this is merely an example, and the configuration and material of the first electrode E1 and the second electrode E2 may be modified variously. Also, in some cases, the first electrode E1 and the second electrode E2 may not be formed.

The first material layer ML1 may be provided on a given (or, alternatively predetermined) region of the substrate SUB1, and the tunnel barrier layer TL1 may be provided on a first region of the first material layer ML1 to extend to a region of the substrate SUB1 adjacent thereto. The second material layer ML2 may be provided on a first region of the tunnel barrier layer TL1. The second material layer ML2 may extend to a region of the substrate SUB1 adjacent to the first region of the tunnel barrier layer TL1. The first electrode E1 may be provided to cover a second region of the first material layer ML1 and a second region of the tunnel barrier layer TL1 adjacent thereto. The second electrode E2 may be provided on the second material layer ML2 and may extend to a region of the substrate SUB1. The first material layer ML1 and the second material layer ML2 are separated from each other with the tunnel barrier layer TL1 therebetween, and the first electrode E1 and the second electrode E2 are spaced apart from each other. When a voltage is applied to the first electrode E1 and the second electrode E2, a tunneling current may be generated through the tunnel barrier layer TL1 between the first material layer ML1 and the second material layer ML2.

In FIG. 1, the conductivity type of the first material layer ML1 and the conductivity type of the second material layer ML2 may be replaced with each other. That is, the first material layer ML1 may be N-doped or may have N-doped characteristics, and the second material layer ML2 may be P-doped or may have P-doped characteristics. Alternatively, the first material layer ML1 may be P-doped or may have P-doped characteristics, and the second material layer ML2 may be N-doped or may have N-doped characteristics. In FIG. 1, the structures of the respective layers ML1, TL1, ML2, E1 and E2 may be modified. In addition, the structure of the tunneling device of FIG. 1 may be modified variously.

The tunneling device illustrated in FIG. 1 may be referred to as a vertical tunneling device, because the first material layer ML1, the tunnel barrier layer TL1, and the second material layer ML2 are vertically stacked and the tunneling device uses a tunneling current flowing through the tunnel barrier layer TL1. The tunneling device of FIG. 1 may be referred to as a 2D material-based tunneling device, because some or all of the first material layer ML1, the tunnel barrier layer TL1, and the second material layer ML2 are formed of the 2D material. Also, the tunneling device of FIG. 1 may be referred to as a heterojunction-structure tunneling device, because the material of the first material layer ML1 is different from the material of the tunnel barrier layer TL1 and the material of the second material layer ML2 is different from the material of the tunnel barrier layer TL1.

Figure 2:
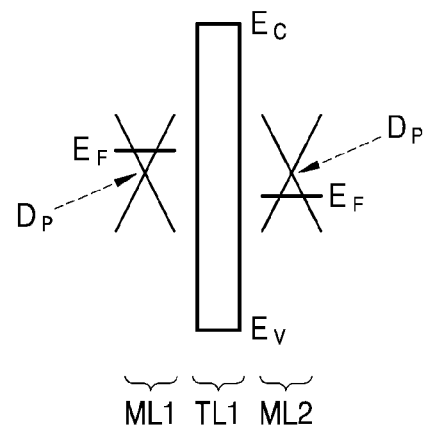
FIG. 2 is a flat energy band diagram of layers constituting the tunneling device according to an example embodiment.

FIG. 2 is a flat energy band diagram of the layers constituting the tunneling device according to an example embodiment. That is, FIG. 2 illustrates energy bands of the respective layers ML1, TL1 and ML2 in the case where the first material layer ML1, the tunnel barrier layer TL1, and the second material layer ML2 of FIG. 1 are independent of each other (i.e., spaced apart from each other). In FIG. 2, "$E_V$" denotes a valence band maximum energy level, "$E_S$" denotes a conduction band minimum energy level, and "$E_F$" denotes a Fermi energy level. Also, $D_P$ denotes a Dirac point. This denotation is also the same in FIGS. 3, 4A and 4B.

Referring to FIG. 2, the energy bands of the first material layer ML1 and the second material layer ML2 are illustrated on both sides of the tunnel barrier layer TL1 having a bandgap. The energy band of the first material layer ML1 is the energy band of the P-doped graphene, and the energy band of the second material layer ML2 is the energy band of the N-doped graphene. The Fermi level $E_F$ is present above the Dirac point $D_P$ in the energy band of the first material layer ML1, and the Fermi level $E_F$ is present below the Dirac point $D_P$ in the energy band of the second material layer ML2. When the tunnel barrier layer TL1 is formed of h-BN, the tunnel barrier layer TL1 may have a bandgap of about 6 eV.

Figure 3:
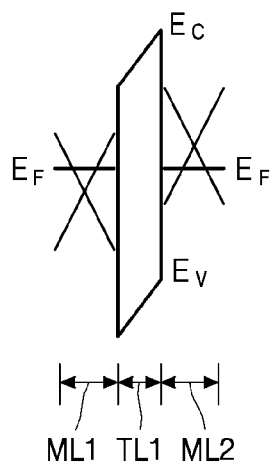
FIG. 3 is an energy band diagram in an equilibrium state of the tunneling device according to an example embodiment.

When the first material layer ML1, the tunnel barrier layer TL1, and the second material layer ML2 are joined to (or contact) each other in an actual device, the energy band diagram may be the same as in FIG. 3. That is, FIG. 3 is an energy band diagram of the tunneling device according to an example embodiment. The energy band diagram of FIG. 3 is an energy band diagram in an equilibrium state in which a voltage is not applied to the first material layer ML1 and the second material layer ML2.

Referring to FIG. 3, when the first material layer ML1, the tunnel barrier layer TL1, and the second material layer ML2 are joined to each other in an actual device, the Fermi level $E_F$ of the first material layer ML1 and the Fermi level $E_F$ of the second material layer ML2 become equal to each other, and thus the energy band of the tunnel barrier layer TL1 is bent. The energy band of the tunnel barrier layer TL1 is bent because the first material layer ML1 and the second material layer ML2 are respectively a P-type and an N-type and have different work functions. When the energy band of the tunnel barrier layer TL1 is bent, a relatively thin band region is formed at an upper portion and a lower portion of the energy band of the tunnel barrier layer TL1. The energy band of the tunnel barrier layer TL1 may be bent as much as the work function difference between the first material layer ML1 and the second material layer ML2. In this regard, a difference between the $E_C$ of the tunnel barrier layer TL1 on the side of the first material layer ML1 and the $E_C$ of the tunnel barrier layer TL1 on the side of the second material layer ML2 may be about 0.6 eV to about 2.7 eV or about 1.0 eV to about 2.7 eV. Likewise, a difference between the $E_V$ of the tunnel barrier layer TL1 on the side of the first material layer ML1 and the $E_V$ of the tunnel barrier layer TL1 on the side of the second material layer ML2 may be about 0.6 eV to about 2.7 eV or about 1.0 eV to about 2.7 eV.

Figure 4A:
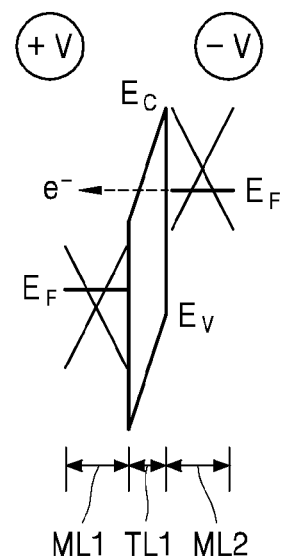
FIG. 4A is an energy band diagram in a first voltage condition of the tunneling device according to an example embodiment.

FIG. 4A is an energy band diagram in a first voltage condition of the tunneling device according to an example embodiment. That is, FIG. 4A illustrates a changed energy band diagram of the tunneling device in the case where a positive (+) voltage is applied to the first material layer ML1 and a negative (−) voltage is applied to the second material layer ML2.

Referring to FIG. 4A, when a positive (+) voltage is applied to the first material layer ML1 and a negative (−) voltage is applied to the second material layer ML2, the energy band of the first material layer ML1 may fall as a whole and the energy band of the second material layer ML2 may rise as a whole. Also, the energy band of the tunnel barrier layer TL1 may be bent more severely. Thus, a tunneling charge (electrons) may easily flow from the second material layer ML2 to the first material layer ML1 through a thin region at the upper band portion of the tunnel barrier layer TL1. In this case, the tunneling device may be in an ON state. The tunneling of the charge (electrons) may be Fowler-Nordheim (F-N) tunneling. The F-N tunneling has high efficiency and generates a large current, and thus may be advantageous for increasing an on-current.

Figure 4B:
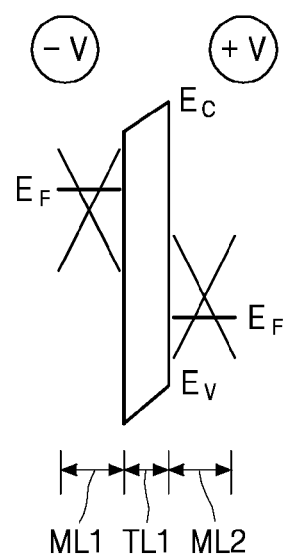
FIG. 4B is an energy band diagram in a second voltage condition of the tunneling device according to an example embodiment.

FIG. 4B is an energy band diagram in a second voltage condition of the tunneling device according to an example embodiment. That is, FIG. 4B illustrates a changed energy band diagram of the tunneling device in the case where a negative (−) voltage is applied to the first material layer ML1 and a positive (+) voltage is applied to the second material layer ML2.

Referring to FIG. 4B, when a negative (−) voltage is applied to the first material layer ML1 and a positive (+) voltage is applied to the second material layer ML2, the energy band of the first material layer ML1 may rise as a whole and the energy band of the second material layer ML2 may fall as a whole. Also, the energy band bending of the tunnel barrier layer TL1 may be reduced as compared to the case of an equilibrium state (FIG. 3). In this case, a tunneling current hardly flows between the first material layer ML1 and the second material layer ML2, and the tunneling device may be in an OFF state.

Figure 5:
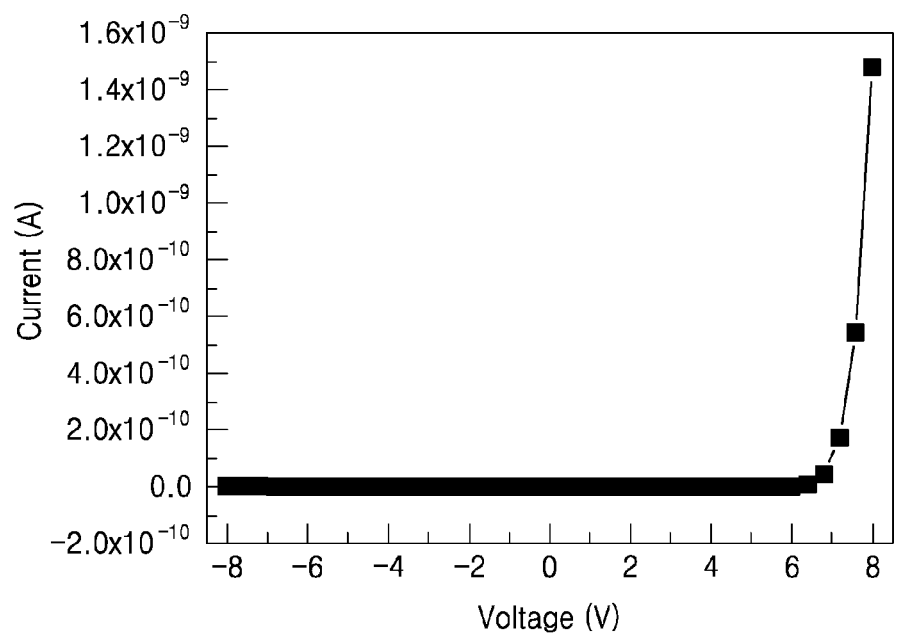
FIG. 5 is a graph illustrating voltage-current characteristics of the tunneling device according to an example embodiment.

FIG. 5 is a graph illustrating voltage-current characteristics of the tunneling device according to an example embodiment. The tunneling device according to the this embodiment has the structure of FIG. 1 and uses P-doped graphene, N-doped graphene, and an h-BN layer as the first material layer ML1, the second material layer ML2, and the tunnel barrier layer TL1, respectively. In this case, the tunnel barrier layer TL1 has a thickness of about 8.7 nm. In FIG. 5, a voltage corresponding to an X axis of FIG. 5 represents a difference between a voltage applied to the first material layer ML1 and a voltage applied to the second material layer ML2.

Referring to FIG. 5, it may be seen that the tunneling device according to this embodiment has rectification characteristics like a diode. That is, while almost no current flows in the range of a negative (−) voltage to a given (or, alternatively predetermined) positive (+) voltage, a current increases greatly at a voltage higher than the given (or, alternatively predetermined) positive (+) voltage. A turn-on voltage may vary depending on the material and thickness of the tunnel barrier layer TL1 (see FIG. 1). Also, the turn-on voltage may vary depending on the work functions and doping concentrations of the first material layer ML1 (see FIG. 1) and the second material layer ML2 (see FIG. 1). For example, when the thickness of the tunnel barrier layer TL1 (see FIG. 1) is reduced or the work function(s) and/or the doping concentration(s) of the first material layer ML1 (see FIG. 1) and/or the second material layer ML2 (see FIG. 1) are changed, a tunneling device having a turn-on voltage of about 1 V or less may be obtained.

According to an example embodiment, the characteristics of the tunneling device may be improved by using the energy band bending of the tunnel barrier layer TL1 due to a resultant work function change of the first material layer ML1 and the second material ML2 on both sides of the tunnel barrier layer TL1. For example, in a voltage range in which direct tunneling is generated in an undoped graphene/h-BN/undoped graphene structure, F-N tunneling may be generated in the structure of this embodiment, and thus a large tunneling current may be obtained at a low voltage and a high on/off current ratio may be obtained.

Also, according to an example embodiment, a tunneling device having rectification characteristics like a diode may be implemented. In this regard, the tunneling device of this embodiment may have a two-terminal structure. Also, the tunneling device of this embodiment may be referred to as a diode. A related art tunneling field effect transistor (TFET) that is operated by a gating operation of a gate electrode has large power consumption and low operation efficiency due to the gating operation. However, since the tunneling device according to an example embodiment does not use a gate electrode, the tunneling device may have low power consumption and high operation efficiency. Since a work function variation of the first material layer ML1 and the second material layer ML2 due to P/N doping is relatively large, which thus results in the energy band of the tunnel barrier layer TL1 being bent, a large current may be easily generated at a low voltage without using a gate electrode.

Also, according to an example embodiment, the characteristics of the tunneling function may be easily controlled by controlling the work functions and doping concentrations of the first material layer ML1 and the second material layer ML2. That is, by controlling a work function variation of the first material layer ML1 and the second material layer ML2, an energy band change of the tunnel barrier layer TL1 may be controlled, and thus the characteristics of a vertical transport barrier may be easily controlled.

In addition, according to an example embodiment, since a 2D material-based tunneling device is manufactured, a tunneling device having a very small size may be easily implemented and may thus have various advantages in various application fields.

Therefore, according to an example embodiment, it is possible to implement a tunneling device having high tunneling current intensity and high tunneling probability, a tunneling device having a high on-current level, a tunneling device having rectification characteristics, a tunneling device having a two-terminal structure, a tunneling device having low power consumption, a tunneling device having controlled/improved operation characteristics, and a tunneling device having a small size.

In FIGS. 1 to 5, a description has been given mainly of the case where P-doped graphene and N-doped graphene are used as the first material layer ML1 and the second material layer ML2, respectively. However, in another example embodiment, materials (2D materials) other than graphene may be used as the first material layer ML1 and the second material layer ML2. That is, a material (2D material) inherently having P-type characteristics even without being doped may be used instead of P-doped graphene, and likewise, a material (2D material) inherently having N-type characteristics even without being doped may be used instead of N-doped graphene. The material (2D material) inherently having P-type characteristics may be a TMDC material, but is not limited thereto. As an example, the material (2D material) inherently having P-type characteristics may be one of $WSe_2$, $NbSe_2$, and GaSe. The material (2D material) inherently having N-type characteristics may be a TMDC material, but is not limited thereto. As an example, the material (2D material) inherently having N-type characteristics may be one of $MoS_2$, $MoSe_2$, $MoTe_2$, $WS_2$, $WSe_2$, $WTe_2$, and GaS.

A $WSe_2$ layer may have bipolar characteristics. That is, in some cases, the $WSe_2$ layer may have P-type characteristics or N-type characteristics. For example, when the $WSe_2$ layer contacts a Pd electrode, the $WSe_2$ layer may have P-type characteristics, and when the $WSe_2$ layer contacts an Ag, In, Al or Ti electrode, the $WSe_2$ layer may have N-type characteristics. On the other hand, the bandgap of an $MoS_2$ layer may vary depending on the thickness thereof. When the $MoS_2$ layer is thin, it may have a bandgap of about 1.8 eV, and when the $MoS_2$ layer is thick, it may have a bandgap of about 1.2 eV.

Thus, a thin $MoS_2$ layer may be used as the tunnel barrier layer TL1, and a thick $MoS_2$ layer may be used as the N-type material layer.

According to an example embodiment, the respective layers ML1, TL1 and ML2 of the tunneling device may have such materials as shown in Table 1 below. The embodiment of Table 1 corresponds to the case where the graphene is used as the first material layer ML1 and the second material layer ML2.

TABLE 1

| Classification | Example of Component Material (Embodiment 1) |
|---|---|
| First Material Layer ML1 | P-doped Graphene |
| Tunnel Barrier Layer TL1 | h-BN, TMDC(e.g., $MoS_2$), GaS, GaSe, oxide(e.g., $Al_2O_3$, HfOx, $SiO_2$) |
| Second Material Layer ML2 | N-doped Graphene |

In Table 1, the P-doped graphene and the N-doped graphene may have semimetal characteristics or characteristics similar to semimetal characteristics. The position of the P-doped graphene and the position of the N-doped graphene may be replaced with each other. That is, the N-doped graphene may be used as the first material layer ML1, and the P-doped graphene may be used as the second material layer ML2.

According to another example embodiment, the respective layers ML1, TL1 and ML2 of the tunneling device may have such materials as shown in Table 2 below. The embodiment of Table 2 corresponds to the case where 2D materials other than graphene are used as the first material layer ML1 and the second material layer ML2.

TABLE 2

| Classification | Example of Component Material (Embodiment 2) |
|---|---|
| First Material Layer ML1 | $WSe_2$, $NbSe_2$, GaSe |
| Tunnel Barrier Layer TL1 | h-BN, oxide having a bandgap of more than about 1.0 eV (e.g., $Al_2O_3$, HfOx, $SiO_2$) |
| Second Material Layer ML2 | $MoS_2$, $MoSe_2$, $MoTe_2$, $WS_2$, $WSe_2$, $WTe_2$, GaS |

In Table 2, $WSe_2$, $NbSe_2$, GaSe, $MoS_2$, $MoSe_2$, $MoTe_2$, $WS_2$, $WTe_2$, and GaS may be a semiconductor having a given (or, alternatively predetermined) bandgap or may have similar characteristics thereto. The material used as the tunnel barrier layer TL1, that is, h-BN or an oxide (dielectric), such as $Al_2O_3$, HfOx, $SiO_2$, or the like, may have a larger bandgap than the first material layer ML1 and the second material layer ML2. In FIG. 2, the material of the first material layer ML1 and the material of the second material layer ML2 may be replaced with each other. That is, $MoS_2$, $MoSe_2$, $MoTe_2$, $WS_2$, $WSe_2$, $WTe_2$, or GaS may be used as the first material layer ML1, and $WSe_2$, $NbSe_2$, or GaSe may be used as the second material layer ML2.

In Table 2, $MoS_2$ may function as a barrier since $MoS_2$ is an N-type material usable as the second material layer ML2 and has a given (or, alternatively predetermined) bandgap. Thus, as in Table 1, $MoS_2$ may be used as the material of the tunnel barrier layer TL1. Also, as described above, the bandgap of an $MoS_2$ layer may vary depending on the thickness thereof. When the $MoS_2$ layer is thin, it may have a bandgap of about 1.8 eV, and when the $MoS_2$ layer is thick, it may have a bandgap of about 1.2 eV. Thus, a thin $MoS_2$ layer may be used as the tunnel barrier layer TL1, and a thick $MoS_2$ layer may be used as the N-type material layer (e.g., ML2).

As in Table 2, when the materials inherently having P-type or N-type characteristics (e.g., $WSe_2$, $NbSe_2$, GaSe, $MoS_2$, $MoSe_2$, $MoTe_2$, $WS_2$, $WTe_2$, and GaS) are used, since a doping process (chemical doping process) is not necessary, the manufacturing process may be simplified and the tunneling device may be easily manufactured.

FIGS. 6A to 6H are cross-sectional views illustrating a method of manufacturing a tunneling device according to an example embodiment.

Figure 6A:
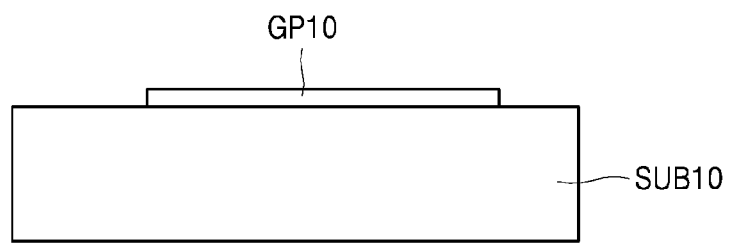
FIGS. 6A to 6H are cross-sectional views illustrating a method of manufacturing a tunneling device according to an example embodiment.

Referring to FIG. 6A, a first graphene layer GP10 may be formed on a substrate SUB10. For example, the substrate SUB10 may include a silicon substrate. In this case, the substrate SUB10 may further include a silicon oxide layer formed on the silicon substrate. Thus, the substrate SUB10 may have an Si/$SiO_2$ structure. However, the material of the substrate SUB10 is not limited to silicon, but may be modified variously. Also, the material of the silicon oxide layer may be modified variously. The silicon oxide layer (i.e., underlayer) may not be formed.

The first graphene layer GP10 may be formed on another substrate (not illustrated) by chemical vapor deposition (CVD) or pyrolysis and then transferred to the substrate SUB10. Alternatively, the first graphene layer GP10 may be grown directly on the substrate SUB10. The first graphene layer GP10 may include about one to about ten graphene layers. The first graphene layer GP10 may include a single graphene layer or may have a stack of about ten or less graphene layers. A graphene growth method and a graphene transfer method are well-known in the art, and thus a detailed description thereof is omitted herein.

Figure 6B:
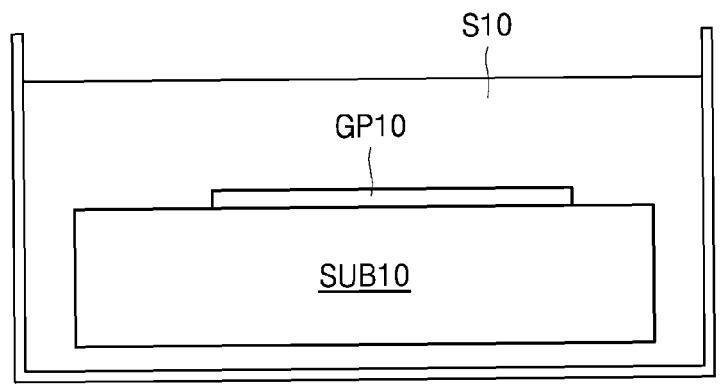

Referring to FIG. 6B, the first graphene layer GP10 may be doped with a first conductivity type dopant (e.g., P-type dopant). The doping may be performed by a chemical doping process. For example, the doping may be performed by a solution process. As an example, as illustrated in FIG. 6B, by dipping the first graphene layer GP10 into a first solution S10 including a P-type dopant, the first graphene layer GP10 may be doped with the P-type dopant. Alternatively, by coating the first graphene layer GP10 with the first solution S10, the first graphene layer GP10 may be doped with the P-type dopant. In this case, a spin coating process may be used.

For example, at least one of $AuCl_3$ and diazonium salt may be used as a source of the P-type dopant. For example, the diazonium salt may include 4-Bromobenzene diazonium tetrafluoroborate (4-BBDT). Au may act as a P-type dopant in the $AuCl_3$, and a bromine group may act as a P-type dopant in the diazonium salt.

Figure 6C:
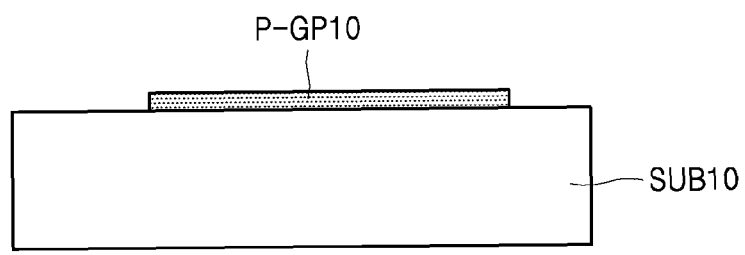

As a result of the doping process of FIG. 6B, a P-doped first graphene layer P-GP10 may be obtained as illustrated in FIG. 6C. The P-doped first graphene layer P-GP10 may correspond to the first material layer ML1 of FIG. 1.

Figure 6D:
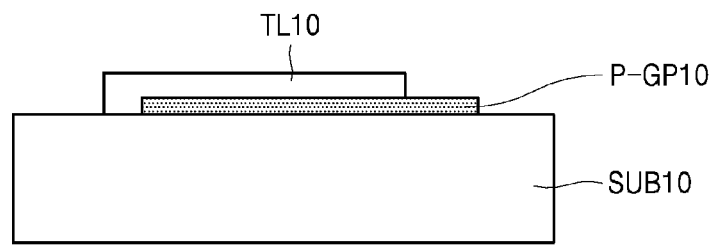

Referring to FIG. 6D, a tunnel barrier layer TL10 may be formed on a first region of the P-doped first graphene layer P-GP10 to extend to a region of the substrate SUB10 adjacent thereto. The tunnel barrier layer TL10 may be formed of a material layer having a given (or, alternatively predetermined) bandgap. The tunnel barrier layer TL10 may be formed of a 2D material. The 2D material of the tunnel barrier layer TL10 may be formed of materials other than graphene. For example, the tunnel barrier layer TL10 may be formed of one of h-BN, $MoS_2$, $MoSe_2$, $MoTe_2$, $WS_2$, $WSe_2$, $WTe_2$, GaS, and GaSe. Also, the tunnel barrier layer TL10 may be formed of a TMDC material. For example, the TMDC material may be represented by $MX_2$, where M is a transition metal and X is a chalcogen element. The M may be Ti, Zr, Hf, V, Nb, Ta, Mo, W, or the like, and the X may be S, Se, or Te. For example, the TMDC material may be $MoS_2$, $MoSe_2$, $MoTe_2$, $WS_2$, $WSe_2$, $WTe_2$, or the like. In some cases, the tunnel barrier layer TL10 may be formed of materials other than the 2D material. For example, the tunnel barrier layer TL10 may be formed of a dielectric (e.g., oxide) having a bandgap of more than about 1.0 eV (or 2.0 eV). For example, the dielectric (e.g., oxide) may be $Al_2O_3$, HfOx, $SiO_2$, or the like. The tunnel barrier layer TL10 may be a dielectric layer or a semiconductor layer having a relatively large bandgap. The tunnel barrier layer TL10 may be formed to have a thickness of about 10 nm or less. However, in some cases, the tunnel barrier layer TL10 may have a thickness of about 10 nm or more.

As an example, when the tunnel barrier layer TL10 is formed of h-BN, the tunnel barrier layer TL10 may be formed by stacking laminated h-BN on the P-doped first graphene layer P-GP10. This is merely an example, and the tunnel barrier layer TL10 may be formed by various other methods.

Figure 6E:
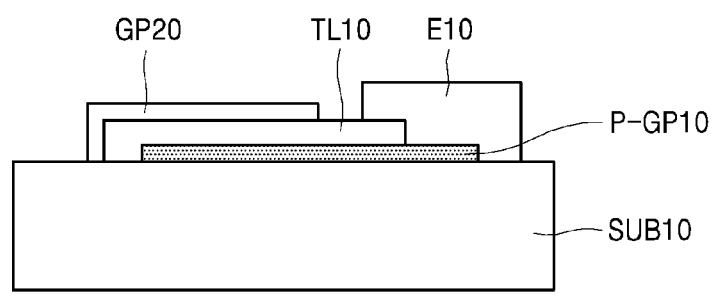

Referring to FIG. 6E, a first electrode E10 may be formed to cover a second region of the P-doped first graphene layer P-GP10 and a portion of the tunnel barrier layer TL10 adjacent thereto. The first electrode E10 may be formed of a metal, a metal compound, a conductive oxide, or the like. The first electrode E10 may be formed to have a single-layer structure or a multi-layer structure. For example, the first electrode E10 may be formed to have a multi-layer structure including a Ti layer and an Au layer, that is, a Ti/Au structure. However, this is merely an example, and the configuration and material of the first electrode E10 may be modified variously.

Thereafter, a second graphene layer GP20 may be formed on a first region of the tunnel barrier layer TL10. The forming or transferring method of the second graphene layer GP20 may be identical to or similar to that of the first graphene layer GP10 of FIG. 6A.

Figure 6F:
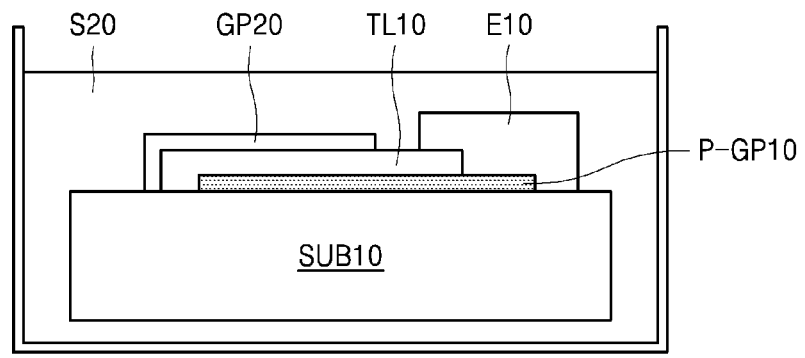

Referring to FIG. 6F, the second graphene layer GP20 may be doped with a second conductivity type dopant (e.g., N-type dopant). The above doping process may be similar to the process of doping the first graphene layer GP10 with the P-type dopant in FIG. 6B. That is, as illustrated in FIG. 6F, by dipping the second graphene layer GP20 into a second solution S20 including an N-type dopant, the second graphene layer GP20 may be doped with the N-type dopant. Alternatively, by spin-coating the second graphene layer GP20 with the second solution S20 including the N-type dopant, the second graphene layer GP20 may be doped with the N-type dopant.

For example, at least one of benzyl-viologen (BV) and polyethylenimine (PEI) may be used as a source of the N-type dopant. Nitrogen atoms of viologen may act as an N-type dopant in the BV, and an amine group may act as an N-type dopant in the PEI. In this process, since the P-doped first graphene layer P-GP10 is covered with the tunnel barrier layer TL10 and the first electrode E10, the P-doped first graphene layer P-GP10 may not be affected by the second solution S20 including the N-type dopant.

Figure 6G:
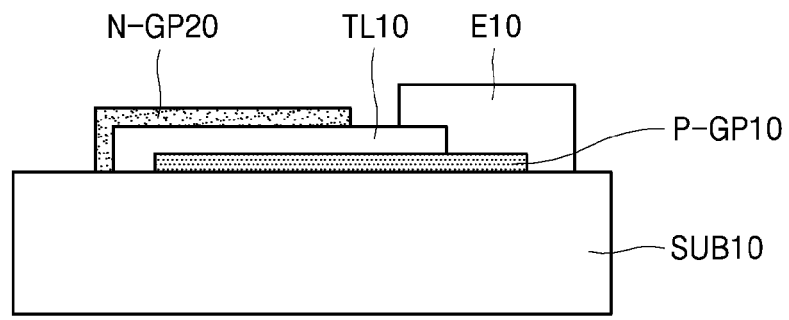

As a result of the doping process of FIG. 6F, an N-doped second graphene layer N-GP20 may be obtained as illustrated in FIG. 6G. The N-doped second graphene layer N-GP20 may correspond to the second material layer ML2 of FIG. 1.

Figure 6H:
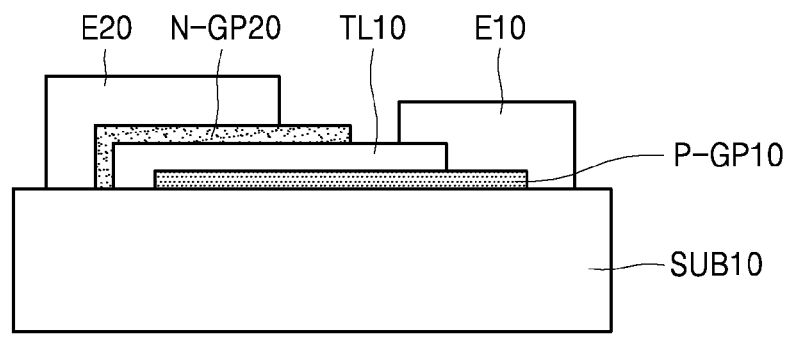

Referring to FIG. 6H, a second electrode E20 may be formed on the N-doped second graphene layer N-GP20. The material and the forming method of the second electrode E20 may be identical to or similar to those of the first electrode E10.

Figure 7:
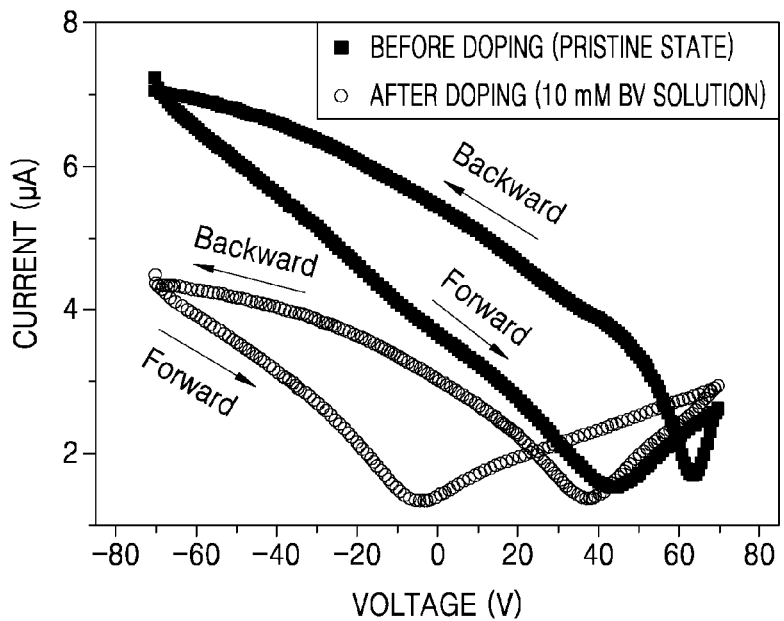
FIG. 7 is a graph illustrating a change in the characteristics of a graphene depending on N-doping that may be used in the method of manufacturing a tunneling device according to an example embodiment.

FIG. 7 is a graph illustrating a change in the characteristics of graphene depending on N-doping. After graphene was N-doped by using a solution obtained by mixing benzyl-viologen (BV) with toluene at a concentration of about 10 mmol, a transistor using the doped graphene as a channel was manufactured. Thereafter, voltage (gate voltage)-current (drain current) characteristics of the transistor were measured. Also, for comparison, the characteristics of an undoped pristine graphene were estimated.

Referring to FIG. 7, it may be seen that the voltage-current characteristics change considerably by the N-doping. It may be seen that the graph shifted down and left as a whole after the N-doping. In this case, a doping concentration is about $1.2 \times 10^{13}/cm^2$, and a Fermi level variation $\Delta E_F$ is about 0.323 eV.

Figure 8:
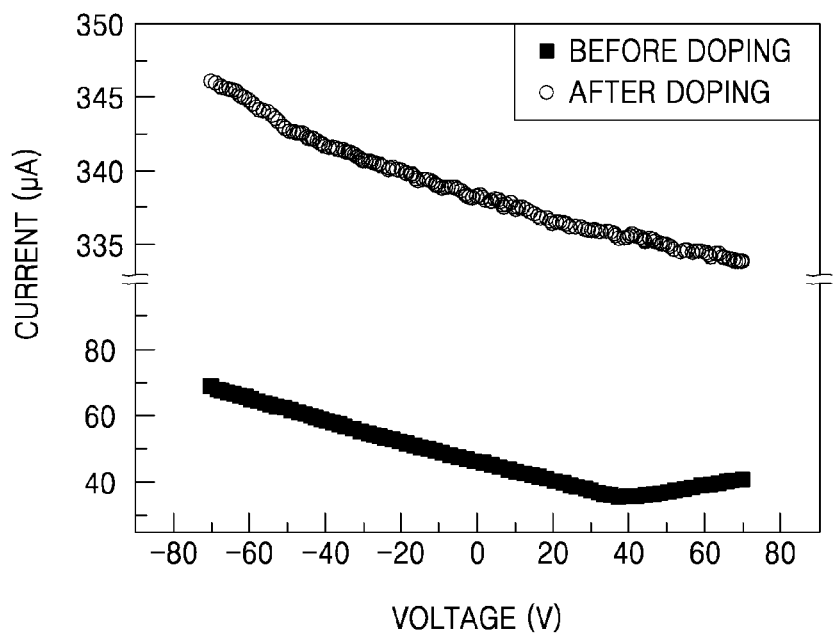
FIG. 8 is a graph illustrating a change in the characteristics of a graphene depending on P-doping that may be used in the method of manufacturing a tunneling device according to an example embodiment.

FIG. 8 is a graph illustrating a change in the characteristics of a graphene depending on P-doping. After graphene was P-doped by using a solution obtained by mixing $AuCl_3$ with nitromethane at a concentration of about 20 mmol, a transistor using the doped graphene as a channel was manufactured. Thereafter, voltage (gate voltage)-current (drain current) characteristics of the transistor were measured. Also, for comparison, the characteristics of an undoped pristine graphene were estimated.

Referring to FIG. 8, it may be seen that the voltage-current characteristics changed considerably by the P-doping. After the P-doping, the graph shifted up as a whole. In this case, a doping concentration is about $1.44 \times 10^{13}/cm^2$, and a Fermi level variation $\Delta E_F$ is about 0.354 eV.

From FIGS. 7 and 8 and other experiments, the doping concentration may be about $1.0 \times 10^{13}/cm^2$ to about $2.5 \times 10^{13}/cm^2$, and the Fermi level variation $\Delta E_F$ may be about 0.32 eV to about 0.46 eV. Also, the doping concentration increased as a doping solution concentration increased.

In FIGS. 6A to 6H, a description has been given of the case where the P-doped first graphene layer P-GP10 and the N-doped second graphene layer N-GP20 are used. However, materials (2D materials) other than graphene may also be used. That is, a material (2D material) inherently having P-type characteristics even without being doped may be used instead of P-doped first graphene (P-GP10), and likewise, a material (2D material) inherently having N-type characteristics even without being doped may be used instead of N-doped second graphene (N-GP20). For example, the material (2D material) inherently having P-type characteristics may be one of $WSe_2$, $NbSe_2$, and GaSe. For example, the material (2D material) inherently having N-type characteristics may be one of $MoS_2$, $MoSe_2$, $MoTe_2$, $WS_2$, $WSe_2$, $WTe_2$, and GaS. When the materials inherently having P-type or N-type characteristics (e.g., $WSe_2$, $NbSe_2$, GaSe, $MoS_2$, $MoSe_2$, $MoTe_2$, $WS_2$, $WTe_2$, and GaS) are used, since a doping process (chemical doping process) is not necessary, the manufacturing process may be simplified and the tunneling device may be easily manufactured.

The structure of the tunneling device according to an example embodiment is not limited to the structure of FIGS. 1 and 6H, but may be modified variously. Examples of the modified structure are illustrated in FIGS. 9 and 10.

Figure 9:
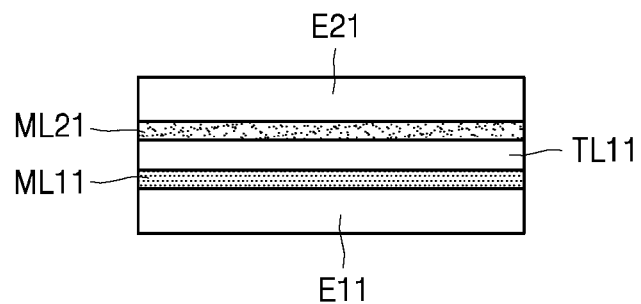
FIG. 9 is a cross-sectional view illustrating a tunneling device according to another example embodiment.

FIG. 9 is a cross-sectional view illustrating a tunneling device according to another example embodiment.

Referring to FIG. 9, a first material layer ML11 may be provided on a first surface (e.g., bottom surface) of a tunnel barrier layer TL11, and a second material layer ML21 may be provided on a second surface (e.g., top surface) of the tunnel barrier layer TL11. That is, the tunnel barrier layer TL11 may be provided between the first material layer ML11 and the second material layer ML21. The tunneling device may further include a first electrode E11 contacting the first material layer ML11, and a second electrode E21 contacting the second material layer ML21. The first material layer ML11 may be provided between the first electrode E11 and the tunnel barrier layer TL11, and the second material layer ML21 may be provided between the second electrode E21 and the tunnel barrier layer TL11. The functions and materials of the tunnel barrier layer TL11, the first material layer ML11, the second material layer ML21, the first electrode E11, and the second electrode E21 may be identical to or similar to those of the tunnel barrier layer TL1, the first material layer ML1, the second material layer ML2, the first electrode E1, and the second electrode E2 of FIG. 1.

Figure 10:
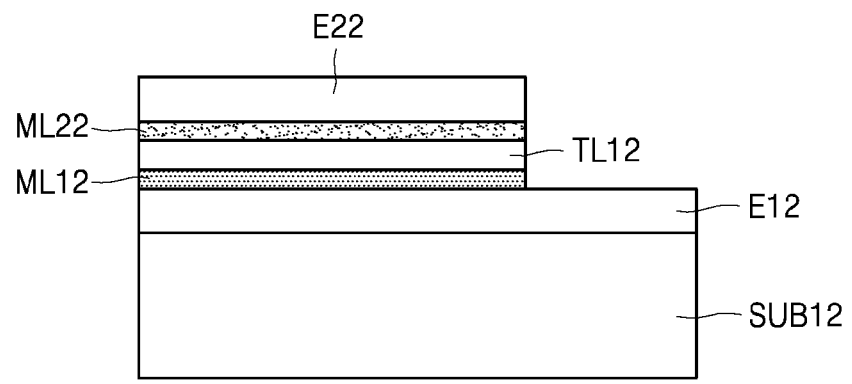
FIG. 10 is a cross-sectional view illustrating a tunneling device according to another example embodiment.

FIG. 10 is a cross-sectional view illustrating a tunneling device according to another example embodiment.

Referring to FIG. 10, a first electrode E12 may be provided on a substrate SUB12, and a first material layer ML12, a tunnel barrier layer TL12, a second material layer ML22, and a second electrode E22 may be sequentially provided on the first electrode E12. The first material layer ML12, the tunnel barrier layer TL12, the second material layer ML22, and the second electrode E22 may have a smaller width than the first electrode E12. Thus, a portion of the first electrode E12 may be exposed, that is, a portion of the first electrode E12 may not be covered with the first material layer ML12. The functions and materials of the substrate SUB12, the first electrode E12, the first material layer ML12, the tunnel barrier layer TL12, the second material layer ML22, and the second electrode E22 may be identical to or similar to those of the substrate SUB1, the first electrode E1, the first material layer ML1, the tunnel barrier layer TL1, the second material layer ML2, and the second electrode E2 of FIG. 1.

The tunneling devices according to embodiments of the present invention may be applied to various electronic circuits and electronic apparatuses for various purposes. In particular, the tunneling devices may be usefully applied to a low-power device, for example, a device that operates at a voltage of about 1 V or less (or 0.5 V or less). The tunneling devices according to the embodiments of the present invention may also be applied to various devices other than the low-power device.

Although many details have been described above, they should be considered in a descriptive sense only and not for purposes of limitation. For example, those of ordinary skill in the art will understand that the structures of the tunneling devices of FIGS. 1, 9 and 10 may be modified variously. As an example, it will be understood that the material characteristics of the first material layer ML1, ML11 or ML12 and the material characteristics of the second material layer ML2, ML21 or ML22 may be replaced with each other, and the structures of the respective layers may be modified variously. It will also be understood that the manufacturing methods of FIGS. 6A to 6H may be modified variously. Therefore, the scope of the inventive concept is defined not by the detailed description of the embodiments but by the technical concept of the appended claims, and all differences within the scope will be construed as being included in the inventive concept.

It should be understood that example embodiments described therein should be considered in a descriptive sense only and not for purposes of limitation. Descriptions of features or aspects within each embodiment should typically be considered as available for other similar features or aspects in other embodiments.

What is claimed is:

1. A tunneling device comprising:
a tunnel barrier layer;
a first material layer on a first surface of the tunnel barrier layer, the first material layer including a P-type two-dimensional (2D) material; and
a second material layer on a second surface of the tunnel barrier layer, the second material layer including an N-type 2D material,
wherein the tunneling device uses a tunneling current through the tunnel barrier layer between the first material layer and the second material layer, and
wherein the first material layer has a work function of about 5.0 eV to about 5.9 eV, and the second material layer has a work function of about 3.2 eV to about 4.0 eV.

2. The tunneling device of claim 1, wherein
the P-type 2D material comprises graphene doped with a P-type dopant, and
the N-type 2D material comprises graphene doped with an N-type dopant.

3. The tunneling device of claim 1, wherein the tunnel barrier layer comprises a 2D material.

4. The tunneling device of claim 3, wherein the tunnel barrier layer comprises one of hexagonal boron nitride (h-BN), $MoS_2$, $MoSe_2$, $MoTe_2$, $WS_2$, $WSe_2$, $WTe_2$, GaS, and GaSe.

5. The tunneling device of claim 3, wherein the tunnel barrier layer comprises a transition metal dichalcogenide (TMDC) material.

6. The tunneling device of claim 1, wherein the tunneling device has rectification characteristics.

7. The tunneling device of claim 1, wherein the tunneling device has a two-terminal structure.

8. The tunneling device of claim 1, further comprising:
a first electrode contacting the first material layer; and
a second electrode contacting the second material layer.

9. The tunneling device of claim 1, further comprising one of:
(i) a substrate including the first material layer on a surface thereof, wherein the tunnel barrier layer is on a first region of the first material layer and extends over a region of the substrate adjacent to the first region of the first material layer, and the second material layer is on a first region of the tunnel barrier layer,
a first electrode on a second region of the first material layer and extends over a second region of the tunnel barrier layer adjacent to the second region of the first material layer, and
a second electrode on the second material layer; and
(ii) a substrate including the second material layer on a surface thereof, wherein the tunnel barrier layer is on a first region of the second material layer and extends over a region of the substrate adjacent to the first region of the second material layer, and the first material layer is on a first region of the tunnel barrier layer,
a first electrode on a second region of the second material layer and extends over a second region of the tunnel barrier layer adjacent to the second region of the second material layer; and
a second electrode on the first material layer.

10. A tunneling device comprising:
a tunnel barrier layer;
a first material layer on a first surface of the tunnel barrier layer, the first material layer including a P-type two-dimensional (2D) material; and
a second material layer on a second surface of the tunnel barrier layer, the second material layer including an N-type 2D material,
wherein the tunneling device uses a tunneling current through the tunnel barrier layer between the first material layer and the second material layer,
the P-type 2D material comprises a P-type transition metal dichalcogenide (TMDC) material, and the N-type 2D material comprises an N-type transition metal dichalcogenide (TMDC) material.

11. A tunneling device comprising:
a tunnel barrier layer;
a first material layer on a first surface of the tunnel barrier layer, the first material layer including a P-type two-dimensional (2D) material; and
a second material layer on a second surface of the tunnel barrier layer, the second material layer including an N-type 2D material,
wherein the tunneling device uses a tunneling current through the tunnel barrier layer between the first material layer and the second material layer,
the P-type 2D material comprises one of $WSe_2$, $NbSe_2$, and GaSe, and
the N-type 2D material comprises one of $MoS_2$, $MoSe_2$, $MoTe_2$, $WS_2$, $WSe_2$, $WTe_2$, and GaS.

12. The tunneling device of claim 11, wherein the tunnel barrier layer comprises one of h-BN and an oxide having a bandgap of more than about 1.0 eV.

13. A method of manufacturing a tunneling device, comprising:
forming a first material layer on a substrate, the first material layer including a first conductivity type two-dimensional (2D) material;
forming a tunnel barrier layer on the first material layer; and
forming a second material layer on the tunnel barrier layer, the second material layer including a second conductivity type 2D material,
wherein the forming a first material layer forms the first material layer to have a work function of about 5.0 eV to about 5.9 eV, and
the forming a second material layer forms the second material layer to have a work function of about 3.2 eV to about 4.0 eV.

14. The method of claim 13, wherein the forming a first material layer comprises:
forming a first graphene layer on the substrate; and
doping the first graphene layer with a first conductivity type dopant by a chemical doping process.

15. The method of claim 14, wherein
the doping dopes the first graphene layer with a P-type dopant,
the P-type dopant has at least one of $AuCl_3$ and diazonium salt as a source.

16. The method of claim 13, wherein the forming a second material layer comprises:
forming a second graphene layer on the tunnel barrier layer; and
doping the second graphene layer with a second conductivity type dopant by a chemical doping process.

17. The method of claim 16, wherein
the doping dopes the second graphene layer with an N-type dopant,
the N-type dopant has at least one of benzyl-viologen (BV) and polyethylenimine (PEI) as a source.

18. The method of claim 13, wherein the forming a tunnel barrier layer forms a 2D material.

19. The method of claim 18, wherein the forming a tunnel barrier layer forms one of hexagonal boron nitride (h-BN), $MoS_2$, $MoSe_2$, $MoTe_2$, $WS_2$, $WSe_2$, $WTe_2$, GaS, and GaSe.

20. The method of claim 13, wherein
the forming a first material layer forms one of $WSe_2$, $NbSe_2$, and GaSe, and
the forming a second material layer forms one of $MoS_2$, $MoSe_2$, $MoTe_2$, $WS_2$, $WSe_2$, $WTe_2$, and GaS.

21. The method of claim 13, further comprising:
forming a first electrode contacting the first material layer; and
forming a second electrode contacting the second material layer.

* * * * *